(12) United States Patent
Koezuka et al.

(10) Patent No.: US 9,659,968 B2
(45) Date of Patent: May 23, 2017

(54) DISPLAY DEVICE COMPRISING A METAL OXIDE SEMICONDUCTOR CHANNEL AND A SPECIFIED INSULATING LAYER ARRANGEMENT

(71) Applicants: Junichi Koezuka, Tochigi (JP); Masahiro Katayama, Tochigi (JP); Yukinori Shima, Tatebayashi (JP); Kenichi Okazaki, Tochigi (JP); Takuya Matsuo, Osaka (JP); Shigeyasu Mori, Osaka (JP); Yosuke Kanzaki, Osaka (JP); Hiroshi Matsukizono, Osaka (JP)

(72) Inventors: Junichi Koezuka, Tochigi (JP); Masahiro Katayama, Tochigi (JP); Yukinori Shima, Tatebayashi (JP); Kenichi Okazaki, Tochigi (JP); Takuya Matsuo, Osaka (JP); Shigeyasu Mori, Osaka (JP); Yosuke Kanzaki, Osaka (JP); Hiroshi Matsukizono, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 8 days.

(21) Appl. No.: 14/244,419

(22) Filed: Apr. 3, 2014

(65) Prior Publication Data

US 2014/0306218 A1   Oct. 16, 2014

(30) Foreign Application Priority Data

Apr. 11, 2013 (JP) .................. 2013-083131

(51) Int. Cl.
*H01L 27/12* (2006.01)
*H01L 23/00* (2006.01)
*H01L 23/31* (2006.01)

(52) U.S. Cl.
CPC ...... *H01L 27/1225* (2013.01); *H01L 27/1248* (2013.01); *H01L 23/3121* (2013.01); *H01L 23/564* (2013.01); *H01L 2924/0002* (2013.01)

(58) Field of Classification Search
CPC   H01L 23/564; H01L 27/1225; H01L 27/1248
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Eduardo A Rodela
*Assistant Examiner* — Christopher M Roland
(74) *Attorney, Agent, or Firm* — Eric J. Robinson; Robinson Intellectual Property Law Office, P.C.

(57) ABSTRACT

Variation in the electrical characteristics of transistors is minimized and reliability of the transistors is improved. A display device includes a pixel portion 104 and a driver circuit portion 106 outside the pixel portion. The pixel portion includes a pixel transistor, a first insulating layer 122 which covers the pixel transistor and includes an inorganic material, a second insulating layer 124 which is over the first insulating layer and includes an organic material, and a third (Continued)

insulating layer 128 which is over the second insulating layer and includes an inorganic material. The driver circuit portion includes a driving transistor for supplying a signal to the pixel transistor, and the first insulating layer covering the driving transistor. The second insulating layer is not formed in the driver circuit portion.

21 Claims, 3 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,911,688 B2 | 6/2005 | Yamazaki et al. | |
| 7,038,239 B2 | 5/2006 | Murakami et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,671,369 B2 | 3/2010 | Yamazaki et al. | |
| 7,674,650 B2 | 3/2010 | Akimoto et al. | |
| 7,732,819 B2 | 6/2010 | Akimoto et al. | |
| 8,115,883 B2 | 2/2012 | Yamazaki et al. | |
| 8,488,077 B2 | 7/2013 | Yamazaki et al. | |
| 8,698,970 B2 | 4/2014 | Yamazaki et al. | |
| 8,879,011 B2 | 11/2014 | Yamazaki et al. | |
| 8,994,889 B2 | 3/2015 | Yamazaki et al. | |
| 9,064,853 B2 | 6/2015 | Nomura et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0081844 A1* | 4/2006 | Hirosue et al. | 257/59 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/1011356 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163868 A1* | 7/2010 | Yamazaki et al. | 257/43 |
| 2011/0062434 A1* | 3/2011 | Eguchi | H01L 27/12 257/43 |
| 2012/0256973 A1* | 10/2012 | Choi et al. | 345/690 |
| 2012/0305920 A1 | 12/2012 | Nagasawa et al. | |
| 2014/0022479 A1 | 1/2014 | Hosaka et al. | |
| 2014/0022480 A1 | 1/2014 | Yokoyama et al. | |
| 2015/0179675 A1 | 6/2015 | Yamazaki et al. | |
| 2015/0303072 A1 | 10/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-071503 A | 4/2011 |
| JP | 2012-248743 A | 12/2012 |

(56) References Cited

FOREIGN PATENT DOCUMENTS

| JP | 2013-062495 A | 4/2013 |
|---|---|---|
| WO | WO-2004/114391 | 12/2004 |
| WO | WO-2012/063614 | 5/2012 |

OTHER PUBLICATIONS

Asaoka.Y et al., "29.1:Polarizer-Free Reflective LCD Combined With Ultra Low-Power Driving Technlogy"; SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors ", IEEE Transactions on Electron Devices, Jul. 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D at al., "Optical Studies of the Amorphous Liquid-Cholesteric Liquid Crystal Transition:The "Blue Phase"", Physics Letters, Sep. 10, 1973, vol. 54A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amourphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest'04 : SID international Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 3, pp. 1624-1630.

Meiboom.S et al., "Theory of the Blue Phase of Cholesteric Liquid Crystals", Phys. Rev. Lett. (Physical Review letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et at., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

DISPLAY DEVICE COMPRISING A METAL OXIDE SEMICONDUCTOR CHANNEL AND A SPECIFIED INSULATING LAYER ARRANGEMENT

BACKGROUND OF THE INVENTION

1. Field of the Invention

The present invention relates to a display device and an electronic device.

2. Description of the Related Art

In recent years, display devices using liquid crystal panels or organic EL panels have been under active development. These display devices are broadly classified into display devices in which only transistors for pixel control (pixel transistors) are formed over a substrate and a scanning circuit (driver circuit) is included in a peripheral IC and display devices in which a scanning circuit is formed over the same substrate as pixel transistors.

A display device in which a driver circuit is integrated with pixel transistors is effective in reducing the frame width of the display device or the cost of the peripheral IC. However, transistors used in the driver circuit are required to have better electrical characteristics (e.g., field-effect mobility (μFE) or threshold voltage) than the pixel transistors.

A silicon-based semiconductor material is widely known as a material for a semiconductor thin film applicable to a transistor. As another material, an oxide semiconductor material has been attracting attention (for example, Patent Documents 1 and 2). For example, attention has been drawn to a transistor including a semiconductor thin film formed using an amorphous oxide that contains indium (In), gallium (Ga), and zinc (Zn) and has an electron carrier concentration of less than $10^{18}/cm^3$.

A transistor using an oxide semiconductor for a semiconductor layer has higher field-effect mobility than a transistor using for a semiconductor layer amorphous silicon which is a silicon-based semiconductor material. Hence, the transistor using an oxide semiconductor operates at high speed and is suitably used for the display device in which a driver circuit is integrated with pixel transistors. Besides, manufacturing steps of the transistor using an oxide semiconductor are easier than those of a transistor using polycrystalline silicon for a semiconductor layer.

However, the transistor using an oxide semiconductor for a semiconductor layer is disadvantageous in that entry of impurities such as hydrogen or moisture into the oxide semiconductor generates carriers to change the threshold voltage of the transistor, which is one of the electrical characteristics of the transistor.

REFERENCES

Patent Documents

[Patent Document 1] Japanese Published Patent Application No. 2007-123861

[Patent Document 2] Japanese Published Patent Application No. 2007-096055

SUMMARY OF THE INVENTION

In order to sufficiently maintain the electrical characteristics of the transistor having a channel formed in an oxide semiconductor layer, it is important to remove hydrogen, moisture, and the like from the oxide semiconductor layer as much as possible.

In particular, in the case where a transistor having a channel formed in an oxide semiconductor layer is used in both a pixel portion and a driver circuit portion outside the pixel portion in a display device, the transistor used in the driver circuit portion has an electrical load larger than that of the transistor used in the pixel portion, although depending on the driving method. Thus, the electrical characteristics of the transistor used in the driver circuit portion is important.

In addition, such a display device in which a transistor having a channel formed in an oxide semiconductor layer is used in the pixel portion and the driver circuit portion has a problem of deterioration of the transistor used in the driver circuit portion (the transistor is also referred to as a driving transistor), which occurs in a reliability test in a high temperature and high humidity environment. A cause of the deterioration of the driving transistor is an increase in the carrier density of the oxide semiconductor layer due to moisture or the like which might be released from an organic material provided for reducing the unevenness of the transistor and enters the oxide semiconductor layer without being released to the outside.

Another cause of the deterioration of the driving transistor is moisture that enters the oxide semiconductor layer of the driving transistor from the outside of the display device.

In view of the above, an object of one embodiment of the present invention is to provide a display device in which a transistor having a channel formed in an oxide semiconductor layer is used in a pixel portion and a driver circuit portion, and which has minimized variation in the electrical characteristics of the transistor and improved reliability. In particular, an object of one embodiment of the present invention is to prevent hydrogen and moisture from entering the oxide semiconductor layer of the transistor in the driver circuit portion, thereby minimizing variation in the electrical characteristics and improving the reliability.

An insulating layer containing an organic material, from which an impurity such as moisture might be released, is not formed over a driving transistor.

A variety of modes of the present invention will be described below. One embodiment of the present invention is a display device including a pixel portion and a driver circuit portion outside the pixel portion. The pixel portion includes a pixel transistor, a first insulating layer which covers the pixel transistor and includes an inorganic material, a second insulating layer which is over the first insulating layer and includes an organic material, and a third insulating layer which is over the second insulating layer and includes an inorganic material. The driver circuit portion includes a driving transistor for supplying a signal to the pixel transistor, and the first insulating layer covering the driving transistor. The second insulating layer is not formed in the driver circuit portion.

In the above embodiment of the present invention, the driver circuit portion may include the third insulating layer over the first insulating layer.

In the above embodiment of the present invention, the first insulating layer may be in contact with the third insulating layer in the driver circuit portion.

The above embodiment of the present invention may include a non-display region outside the driver circuit portion, and the non-display region includes the first insulating layer and does not include the second insulating layer.

In the above embodiment of the present invention, a channel of each of the pixel transistor and the driving transistor may be formed in an oxide semiconductor layer.

In the above embodiment of the present invention, each of the pixel transistor and the driving transistor may include a gate electrode, a gate insulating layer over the gate electrode, an oxide semiconductor layer over the gate electrode with the gate insulating layer therebetween, and a source electrode and a drain electrode over the oxide semiconductor layer.

In the above embodiment of the present invention, the pixel portion may include a layer under the first insulating layer and over the gate insulating layer, and the layer may be formed in the vicinity of the boundary between the driver circuit portion and the pixel portion.

In the above embodiment of the present invention, the layer may be formed in the same layer as the source electrode.

In the above embodiment of the present invention, the oxide semiconductor layer may include at least one oxide selected from the group consisting of indium oxide, tin oxide, and zinc oxide.

In the above embodiment of the present invention, the oxide semiconductor layer may be an In—Ga—Zn-based oxide semiconductor layer.

In the above embodiment of the present invention, the oxide semiconductor layer may include a crystal part and a c-axis of the crystal part may be parallel to a normal vector of a surface where the oxide semiconductor layer is formed.

In the above embodiment of the present invention, the first insulating layer may be a silicon film including oxygen or nitrogen.

In the above embodiment of the present invention, the first insulating layer may have a layered structure of a silicon oxide film and a silicon nitride film.

In the above embodiment of the present invention, the first insulating layer may have a layered structure of a silicon oxynitride film and a silicon nitride film.

In the above embodiment of the present invention, the silicon nitride film may cover a cavity in the silicon oxynitride film.

In the above embodiment of the present invention, the second insulating layer may be an acrylic-based resin material.

In the above embodiment of the present invention, the third insulating layer may be a silicon film including nitrogen.

One embodiment of the present invention is a display device including a pixel portion and a driver circuit portion outside the pixel portion. The pixel portion includes a pixel transistor, a first insulating layer which covers the pixel transistor and includes a silicon film containing oxygen, a second insulating layer which is over the first insulating layer and includes an acrylic-based resin material, and a third insulating layer which is over the second insulating layer and includes a silicon film containing nitrogen. The driver circuit portion includes a driving transistor for supplying a signal to the pixel transistor, and the first insulating layer covering the driving transistor. The second insulating layer is not formed in the driver circuit portion.

In the above embodiment of the present invention, the pixel portion may include a first electrode over the second insulating layer, the third insulating layer over the first electrode, and a second electrode over the third insulating layer.

One embodiment of the present invention is an electronic device including the aforementioned display device.

One embodiment of the present invention makes it possible to provide a display device in which a transistor having a channel formed in an oxide semiconductor layer is used in a pixel portion and a driver circuit portion, and which has minimized variation in the electrical characteristics of the transistor and improved reliability. In particular, one embodiment of the present invention can prevent hydrogen and moisture from entering the oxide semiconductor layer of the transistor in the driver circuit portion, thereby minimizing variation in the electrical characteristics and improving the reliability.

DETAILED DESCRIPTION OF THE INVENTION

Embodiments of the present invention will be described below in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

[Embodiment 1]

In this embodiment, one mode of a semiconductor device will be described with reference to FIGS. 1A and 1B.

Figure 1A:
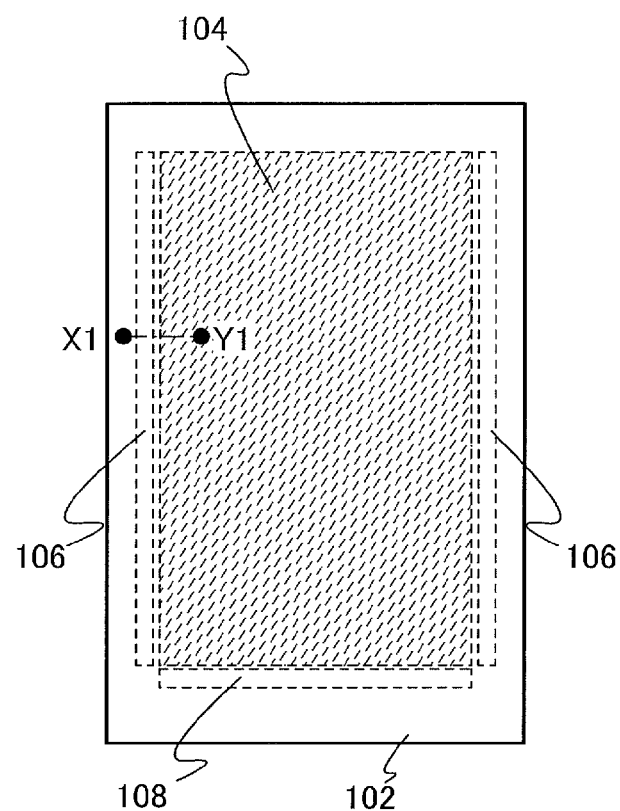
FIG. 1A is a top view of a display device and FIG. 1B is a cross-sectional view along line X1-Y1 in FIG. 1A.

FIG. 1A illustrates a top view of a display device as one mode of a display device. FIG. 1B is a cross-sectional view along line X1-Y1 in FIG. 1A.

In the display device illustrated in FIG. 1A, a sealant (not illustrated) is provided so as to surround a pixel portion 104 over a first substrate 102, and gate driver circuit portions 106 and a source driver circuit portion 108, which are adjacent to the outside of the pixel portion 104 and supply signals to the pixel portion 104. Then, sealing is performed with a second substrate (not illustrated). Thus, the pixel portion 104, the gate driver circuit portions 106, and the source driver circuit portion 108 are sealed with display elements by the first substrate 102, the sealant, and the second substrate.

In FIG. 1A, a flexible printed circuit (FPC) terminal portion (not illustrated) which is electrically connected to the pixel portion 104, the gate driver circuit portions 106, and the source driver circuit portion 108 is provided in a region over the first substrate 102 that is not surrounded by the sealant. An FPC (not illustrated) is connected to the FPC terminal portion. Various signals and potentials are supplied to the pixel portion 104, the gate driver circuit portions 106, and the source driver circuit portion 108 through the FPC.

FIG. 1A shows an example in which the gate driver circuit portions 106 and the source driver circuit portion 108 are formed over the first substrate 102 where the pixel portion 104 is formed; however, the present invention is not limited to this structure. For example, only the gate driver circuit portions 106 may be formed over the first substrate 102 and a separately prepared substrate where a source driver circuit is formed (e.g., a driver circuit substrate formed using a single crystal semiconductor film or a polycrystalline semiconductor film) may be mounted on the first substrate 102.

FIG. 1A shows an example in which the two gate driver circuit portions 106 are placed on both sides of the pixel portion 104, though the present invention is not limited to this example. For example, the gate driver circuit portion 106 may be placed on only a side of the pixel portion 104.

Note that there is no particular limitation on the method of connecting a separately prepared driver circuit substrate, and a chip on glass (COG) method, a wire bonding method, a tape automated bonding (TAB) method, or the like can be used.

As described above, some or all of the driver circuits which include transistors can be formed over the first substrate 102 where the pixel portion 104 is formed, so that a system-on-panel can be obtained.

A driving transistor is formed in the gate driver circuit portion 106 which is a driver circuit. The gate driver circuit portion 106 can supply a signal to a transistor included in each pixel of the pixel portion 104.

To control various signals, raise a voltage, and the like, the driving transistor in the gate driver circuit portion 106 requires a high voltage, specifically a voltage of about 10 V to 30 V.

A pixel transistor is formed in the pixel portion 104.

For specific description of the structure of the display device illustrated in FIG. 1A, the structure of the gate driver circuit portion 106 and the pixel portion 104 is described below with reference to FIG. 1B, the cross-sectional view along line X1-Y1 in FIG. 1A.

Figure 1B:
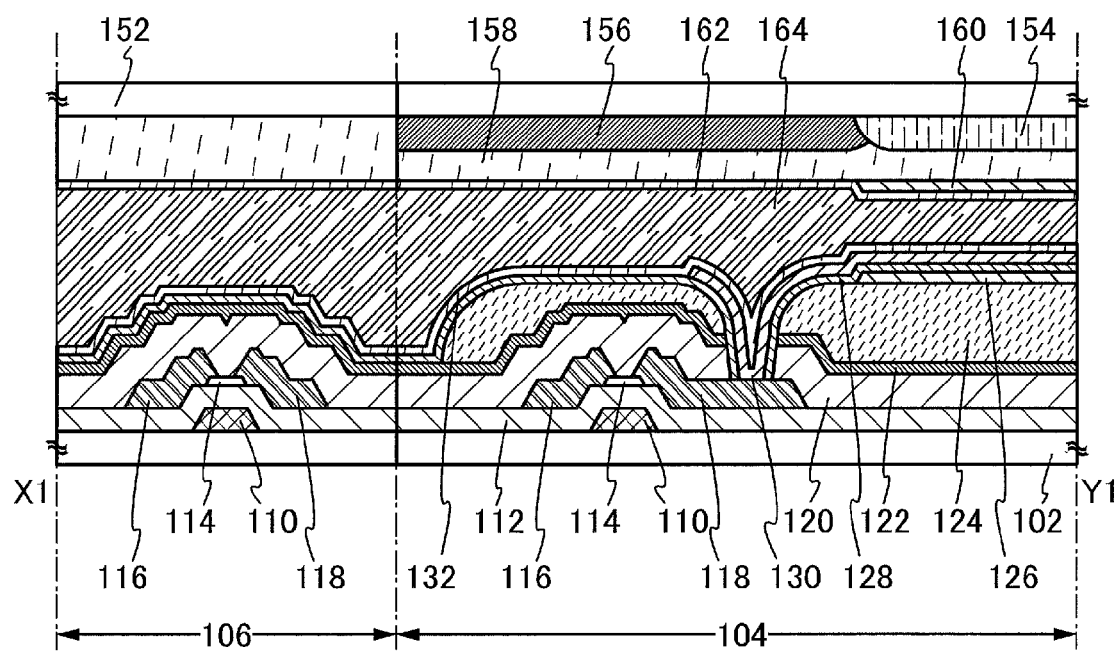

In a display device illustrated in FIG. 1B, a liquid crystal element is used as a display element, and a vertical alignment (VA) mode is used as a driving mode. One mode of the display device is described here.

A layer structure over the gate driver circuit portion 106 and the pixel portion 104 is described first.

In the gate driver circuit portion 106, an insulating layer 120 including a first inorganic material (e.g., SiON) is provided over the driving transistor and a first insulating layer 122 including a second inorganic material (SiN) is provided over the insulating layer 120. In the pixel portion 104, the insulating layer 120 is provided over the pixel transistor, the first insulating layer 122 is provided over the insulating layer 120, and a second insulating layer 124 including an organic material (e.g., an acrylic-based resin) is provided over the first insulating layer 122.

That is to say, the gate driver circuit portion 106 has a structure in which the second insulating layer 124 is not formed, or the second insulating layer 124 is removed after the formation so that the first insulating layer 122 is exposed. In other words, in the gate driver circuit portion 106, the second insulating layer 124 is not formed over the first insulating layer 122 or the first insulating layer 122 is not covered with the second insulating layer 124.

The second insulating layer 124 is formed using an organic material having good flatness in order to reduce the unevenness of the transistor and the like included in the display device. Reduction in the unevenness of the transistor and the like leads to improved display quality of the display device. However, the organic material releases hydrogen, moisture, or an organic component as a gas when it is subjected to heating or the like.

The above-mentioned gas of hydrogen, moisture, or an organic component is unlikely to be a great problem for, for example, a transistor including a semiconductor layer using a silicon film, which is a silicon-based semiconductor material. However, in one embodiment of the present invention, an oxide semiconductor layer is used for the semiconductor layer, and thus the gas of hydrogen, moisture, or an organic component released from the second insulating layer 124 including an organic material degrades the driving transistor.

Thus, in this embodiment, the second insulating layer 124 including an organic material is formed over the first insulating layer 122 in the pixel portion 104 which requires high flatness; on the contrary, in the gate driver circuit portions 106 including the driving transistors and the source driver circuit portion 108, and in the periphery of the panel (non-display region) illustrated in FIG. 1A, the second insulating layer 124 including an organic material is not formed over the first insulating layer 122 or the second insulating layer 124 is removed after the formation. As a result, the gas of moisture or the like released from the second insulating layer 124 can be prevented from entering the driving transistors in the gate driver circuit portions 106 and the source driver circuit portion 108.

Next, the gate driver circuit portion 106 and the pixel portion 104 illustrated in FIG. 1B will be described in detail.

The gate driver circuit portion 106 includes the first substrate 102 and the driving transistor which includes a gate electrode layer 110 formed over the first substrate 102, a gate insulating layer 112 formed over the gate electrode layer 110, the semiconductor layer 114 formed over the gate insulating layer 112, and a source electrode layer 116 and a drain electrode layer 118 formed over the gate insulating layer 112 and the semiconductor layer 114.

Furthermore, in the gate driver circuit portion 106, the insulating layer 120 is formed over the driving transistor, specifically, over the gate insulating layer 112, the semiconductor layer 114, the source electrode layer 116, and the drain electrode layer 118, and the first insulating layer 122 is formed over the insulating layer 120.

The insulating layer 120 or the first insulating layer 122 serves as a protective film for the driving transistor.

A third insulating layer 128 including an inorganic material (e.g., SiN) is provided over the first insulating layer 122, a first alignment film 132 is provided over the third insulating layer 128, a liquid crystal layer 164 is provided over the first alignment film 132, a second alignment film 162 is provided over the liquid crystal layer 164, an organic insulating layer (OC) 158 is provided over the second alignment film 162, and a second substrate 152 is provided over the organic insulating layer 158.

The pixel portion 104 includes the first substrate 102 and the pixel transistor which includes the gate electrode layer 110 formed over the first substrate 102, the gate insulating layer 112 formed over the gate electrode layer 110, the semiconductor layer 114 formed over the gate insulating layer 112, and the source electrode layer 116 and the drain electrode layer 118 formed over the gate insulating layer 112 and the semiconductor layer 114.

Furthermore, in the pixel portion 104, the insulating layer 120 is formed over the pixel transistor, specifically, over the gate insulating layer 112, the semiconductor layer 114, the source electrode layer 116, and the drain electrode layer 118, the first insulating layer 122 is formed over the insulating layer 120, and the second insulating layer 124 is formed over the first insulating layer 122.

The insulating layer 120 or the first insulating layer 122 serves as a protective film for the pixel transistor, and the second insulating layer 124 serves as a planarization film to reduce the unevenness of, for example, the source electrode layer 116 and the drain electrode layer 118 of the pixel transistor.

Further, in the pixel portion 104, a common electrode layer 126 is formed over the second insulating layer 124. The third insulating layer 128 including an inorganic material (e.g., SiN) is formed over the second insulating layer 124 and the common electrode layer 126. An opening reaching the drain electrode layer 118 of the pixel transistor is formed in the insulating layer 120, the first insulating layer 122, the second insulating layer 124, and the third insulating layer 128. A pixel electrode layer 130 is formed in the opening and over the third insulating layer 128.

Note that a capacitor is formed with the common electrode layer 126, the third insulating layer 128, and the pixel electrode layer 130. The common electrode layer 126, the third insulating layer 128, and the pixel electrode layer 130 are each preferably formed using a material transmitting visible light, in which case large capacitance can be obtained without reducing the aperture ratio of the pixel portion.

Over the pixel electrode layer 130 are formed the first alignment film 132, the liquid crystal layer 164 over the first alignment film 132, the second alignment film 162 over the liquid crystal layer 164, a counter electrode layer 160 over the second alignment film 162, the organic insulating layer 158 over the counter electrode layer 160, a coloring layer (CF) 154 and a light-blocking layer (BM) 156 over the organic insulating layer 158, and the second substrate 152 over the coloring layer 154 and the light-blocking layer 156.

Note that a liquid crystal element which is a display element is formed with the pixel electrode layer 130, the first alignment film 132, the liquid crystal layer 164, the second alignment film 162, and the counter electrode layer 160.

Other components of the display device illustrated in FIGS. 1A and 1B will be detailed below.

For the first substrate 102 and the second substrate 152, a glass material such as aluminosilicate glass, aluminoborosilicate glass, or barium borosilicate glass is used. In the mass production, for the first substrate 102 and the second substrate 152, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically shrink the mother glass. Hence, in the mass production using the mother glass, heat treatment in the manufacturing process is preferably performed at 600° C. or lower, more preferably 450° C. or lower, and still more preferably 350° C. or lower.

For the gate electrode layer 110, a metal element selected from aluminum, chromium, copper, tantalum, titanium, molybdenum, and tungsten, an alloy containing any of these metal elements as a component, an alloy containing these metal elements in combination, or the like can be used. Further, the gate electrode layer 110 may have a single-layer structure or a layered structure of two or more layers. Examples of the structure include a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like. Alternatively, a film, an alloy film, or a nitride film which contains aluminum and one or more elements selected from titanium, tantalum, tungsten, molybdenum, chromium, neodymium, and scandium may be used.

Examples of the gate insulating layer 112 are a silicon oxide film, a silicon oxynitride film, a silicon nitride oxide film, a silicon nitride film, an aluminum oxide film, a silicon nitride film, and the like, and a single layer or a stacked layer of such films is used as the gate insulating layer 112.

The gate insulating layer 112 may have a layered structure in which a silicon nitride film having few defects is used as a first silicon nitride film, a silicon nitride film which releases less hydrogen and less ammonia is used as a second silicon nitride film over the first silicon nitride film, and an oxide insulating layer is formed over the second silicon nitride film. In that case, it is possible to obtain the gate insulating layer 112 that has few defects and releases less hydrogen and less ammonia. As a result, transfer of hydrogen and nitrogen, which are contained in the gate insulating layer 112, to the semiconductor layer 114 can be inhibited. For example, a layered structure of a 50-nm-thick silicon oxide film and a 325-nm-thick silicon nitride film can be used as the gate insulating layer 112.

The use of a silicon nitride film as the gate insulating layer 112 offers the following effect. The silicon nitride film has a higher relative permittivity than a silicon oxide film and needs a larger thickness for an equivalent capacitance. Thus, the physical thickness of the gate insulating layer can be increased. This makes it possible to reduce a decrease in withstand voltage of a transistor and furthermore increase the withstand voltage, thereby reducing electrostatic discharge damage to the transistor.

The thickness of the gate insulating layer 112 is 5 nm to 400 nm, preferably 10 nm to 450 nm, and more preferably 50 nm to 400 nm.

An oxide semiconductor is used for the semiconductor layer 114, which preferably contains at least indium (In) or zinc (Zn) or both In and Zn. In order to reduce variation in the electrical characteristics of the transistor including the oxide semiconductor, the oxide semiconductor preferably contains one or more stabilizers in addition to In and/or Zn.

Examples of the stabilizer include gallium (Ga), tin (Sn), hafnium (Hf), aluminum (Al), zirconium (Zr), and the like.

As the oxide semiconductor, for example, any of the following can be used: indium oxide, tin oxide, zinc oxide, an In—Zn-based metal oxide, a Sn—Zn-based metal oxide, an Al—Zn-based metal oxide, an In—Ga-based metal oxide, an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

Note that an In—Ga—Zn-based metal oxide, for example, is an oxide whose main components are In, Ga, and Zn, and there is no particular limitation on the ratio of In:Ga:Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

Further, the energy gap of an oxide semiconductor layer that can be used as the semiconductor layer 114 is 2 eV or higher, preferably 2.5 eV or higher, and more preferably 3 eV or higher. The off-state current of a transistor can be reduced by using such an oxide semiconductor layer having a wide energy gap.

The oxide semiconductor layer used as the semiconductor layer 114 may include a non-single-crystal, for example. The non-single-crystal is, for example, structured by at least one of c-axis aligned crystal (CAAC), polycrystal, microcrystal, and an amorphous part. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned in some cases.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film has disordered atomic arrangement and no crystalline component, for example. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film includes, for example, a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may include a single crystal, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. Note that in most cases, a crystal part included in the CAAC-OS film fits inside a cube whose one side is less than 100 nm. In an image obtained with a transmission electron microscope (TEM), a boundary between crystal parts in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, the term "perpendicular" includes a range from 80° to 100°, preferably a range from 85° to 95°. In addition, the term "parallel" includes a range from −10° to 10°, preferably a range from −5° to 5°. Note that part of oxygen included in the oxide semiconductor layer may be substituted with nitrogen.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

A transistor using the CAAC-OS film has small variation in electrical characteristics due to irradiation with visible light or ultraviolet light, and thus the transistor has high reliability.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

The thickness of the oxide semiconductor layer used as the semiconductor layer 114 is 1 nm to 100 nm, preferably 3 nm to 85 nm.

The concentration of alkali metals or alkaline earth metals in the oxide semiconductor layer used as the semiconductor layer 114, which is obtained by secondary ion mass spectrometry (SIMS), is preferably $1 \times 10^{18}$ atoms/cm$^3$ or lower, more preferably $2 \times 10^{16}$ atoms/cm$^3$ or lower. This is because, when alkali metals or alkaline earth metals are bonded to an oxide semiconductor, some of the alkali metals or the alkaline earth metals generate carriers and cause an increase in the off-state current of the transistor.

In the oxide semiconductor layer used as the semiconductor layer 114, the hydrogen concentration obtained by secondary ion mass spectrometry is preferably lower than $5\times10^{18}$ atoms/cm$^3$, more preferably $1\times10^{18}$ atoms/cm$^3$ or lower, still more preferably $5\times10^{17}$ atoms/cm$^3$ or lower, and yet still more preferably $1\times10^{16}$ atoms/cm$^3$ or lower.

Hydrogen contained in the oxide semiconductor layer reacts with oxygen bonded to a metal atom to produce water, and a defect is formed in a lattice from which oxygen is released (or a portion from which oxygen is removed). In addition, a bond of part of hydrogen and oxygen causes generation of electrons serving as a carrier. Thus, the impurities containing hydrogen are reduced as much as possible in the step of forming the oxide semiconductor layer, allowing a reduction in the hydrogen concentration in the oxide semiconductor layer. By forming a channel region with use of an oxide semiconductor layer from which hydrogen is removed as much as possible, the shift of the threshold voltage in the negative direction can be controlled and variation in electrical characteristics can be reduced. Furthermore, it is possible to reduce the leakage current between a source and a drain of the transistor, typically, the off-state current.

The source electrode layer 116 and the drain electrode layer 118 can be formed to have a single-layer structure or a layered structure using, as a conductive material, any of single metals such as aluminum, titanium, chromium, nickel, copper, yttrium, zirconium, molybdenum, silver, tantalum, and tungsten, or an alloy containing any of these single metals as its main component. Examples of the structure include a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like. Note that a transparent conductive material containing indium oxide, tin oxide, or zinc oxide may be used.

The source electrode layer 116 and the drain electrode layer 118 are provided over the semiconductor layer 114 in this embodiment but may be provided between the gate insulating layer 112 and the semiconductor layer 114.

As the insulating layer 120 or the first insulating layer 122, an oxide insulating layer of an inorganic material is preferably used so as to improve the characteristics of the interface with the oxide semiconductor layer used as the semiconductor layer 114. For example, a silicon film containing oxygen or nitrogen may be used. As the insulating layer 120 or the first insulating layer 122, a silicon oxide film, a silicon oxynitride film, an aluminum oxide film, or the like having a thickness of 150 nm to 400 nm can be used. Alternatively, an oxide insulating layer and a nitride insulating layer may be used as the insulating layer 120 and the first insulating layer 122, respectively. For example, the insulating layer 120 may be a silicon oxynitride film while the first insulating layer 122 may be a silicon nitride film. More specifically, the insulating layer 120 may be a 300-nm-thick silicon oxynitride film while the first insulating layer 122 may be a 150-nm-thick silicon nitride film. In that case, the silicon nitride film serves as a block layer to prevent moisture from entering the semiconductor layer 114 of the transistor. The silicon nitride film is preferably formed at high temperature in order to enhance its blocking property, for example, a substrate temperature of 350° C. is possible. When a cross-section of the thin film transistor as a sample is observed with a scanning electron microscope, in the step resulting from the source and drain electrodes, the silicon nitride film in the upper layer has no cavities reaching the second insulating layer even when the silicon oxynitride film in the lower layer has cavities; therefore, it is observed that the first insulating layer 122 favorably covers the source and drain electrodes. When the silicon nitride film is formed at high temperature, the phenomenon that oxygen is released from the oxide semiconductor layer used as the semiconductor layer 114 and the carrier density is increased is caused in some cases; therefore, the upper limit of the temperature is a temperature at which the phenomenon is not caused.

The second insulating layer 124 can be formed using an organic material having heat resistance, such as an acrylic-based resin, a polyimide-based resin, a benzocyclobutene-based resin, a polyamide-based resin, or an epoxy-based resin. Note that the second insulating layer 124 may be formed by stacking a plurality of insulating layers formed using any of these materials. With the use of the second insulating layer 124, the unevenness of the transistor and the like can be reduced.

The common electrode layer 126 and the pixel electrode layer 130 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The third insulating layer 128 can be formed using an inorganic material such as a silicon oxide film, a silicon oxynitride film, a silicon nitride oxide film, a silicon nitride film, or an aluminum oxide film.

The first alignment film 132 and the second alignment film 162 each can be formed using an organic material having heat resistance such as an acrylic-based resin, a polyimide-based resin, a benzocyclobutene-based resin, a polyamide-based resin, or an epoxy-based resin.

A liquid crystal material that can be used for the liquid crystal layer 164 is thermotropic liquid crystal, low-molecular liquid crystal, high-molecular liquid crystal, polymer dispersed liquid crystal, ferroelectric liquid crystal, anti-ferroelectric liquid crystal, or the like. Such a liquid crystal material exhibits a cholesteric phase, a smectic phase, a cubic phase, a chiral nematic phase, an isotropic phase, or the like depending on conditions.

This embodiment shows an example of the display device using a vertical alignment (VA) mode for the liquid crystal element, without being limited thereto. For example, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, or an antiferroelectric liquid crystal (AFLC) mode can be used.

Examples of the vertical alignment mode include a multi-domain vertical alignment (MVA) mode, and a patterned vertical alignment (PVA) mode. Moreover, it is possible to use a method called domain multiplication or multi-domain design, in which a pixel is divided into some regions (subpixels) and molecules are aligned in different directions in their respective regions.

Although not illustrated in FIGS. 1A and 1B, an optical member (optical substrate) such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

As a display method in the pixel portion 104, progressive scan, interlace scan, or the like can be employed. Further, color elements controlled in a pixel at the time of color display are not limited to three colors: R (red), G (green), and B (blue). For example, R, G, B, and W (white) can be used, or one or more colors of yellow, cyan, magenta, and the like can be added to RGB. Further, the sizes of display regions may be different between respective dots of color elements. Note that the disclosed invention can be applied not only to a display device for color display but also to a display device for monochrome display.

A spacer (not illustrated) is formed on the second substrate 152 so as to control the distance (cell gap) between the first substrate 102 and the second substrate 152. Note that the cell gap determines the thickness of the liquid crystal layer 164. The spacer may have any shape; for example, a spherical spacer or a columnar spacer formed by selective etching of an insulating layer may be used.

The coloring layer 154 functions as a so-called color filter. The coloring layer 154 may be formed using a material transmitting light in a specific wavelength band; for example, an organic resin film including a dye or a pigment can be used.

The light-blocking layer 156 functions as a so-called black matrix. The light-blocking layer 156 can be formed using any film that can block light emitted from adjacent pixels, such as a metal film or an organic resin film including a black dye or a black pigment.

The organic insulating layer 158 is provided so that an ionic substance included in the coloring layer 154 is not dispersed into the liquid crystal layer 164. However, the organic insulating layer 158 is not necessarily provided, without being limited to that structure.

As the sealant, a thermosetting resin, an ultraviolet curable resin, or the like can be used. A region sealed by the sealant has a structure in which the gate insulating layer 112, the insulating layer 120, and the first insulating layer 122 are placed between the first substrate 102 and the second substrate 152; however, the present invention is not limited to this structure. For example, in the region sealed by the sealant, the gate insulating layer 112, the insulating layer 120, the first insulating layer 122, and the third insulating layer 128 may be formed.

The above is the display device of one embodiment of the present invention. In the display device, the transistor having a channel formed in the oxide semiconductor layer has minimized variation in electrical characteristics and improved reliability. In particular, hydrogen and moisture can be prevented from entering the oxide semiconductor layer of the transistor in the driver circuit portion, thereby minimizing variation in the electrical characteristics and improving the reliability.

One embodiment of the present invention can also be applied to an electronic device including the aforementioned display device.

[Embodiment 2]

Figure 2A:
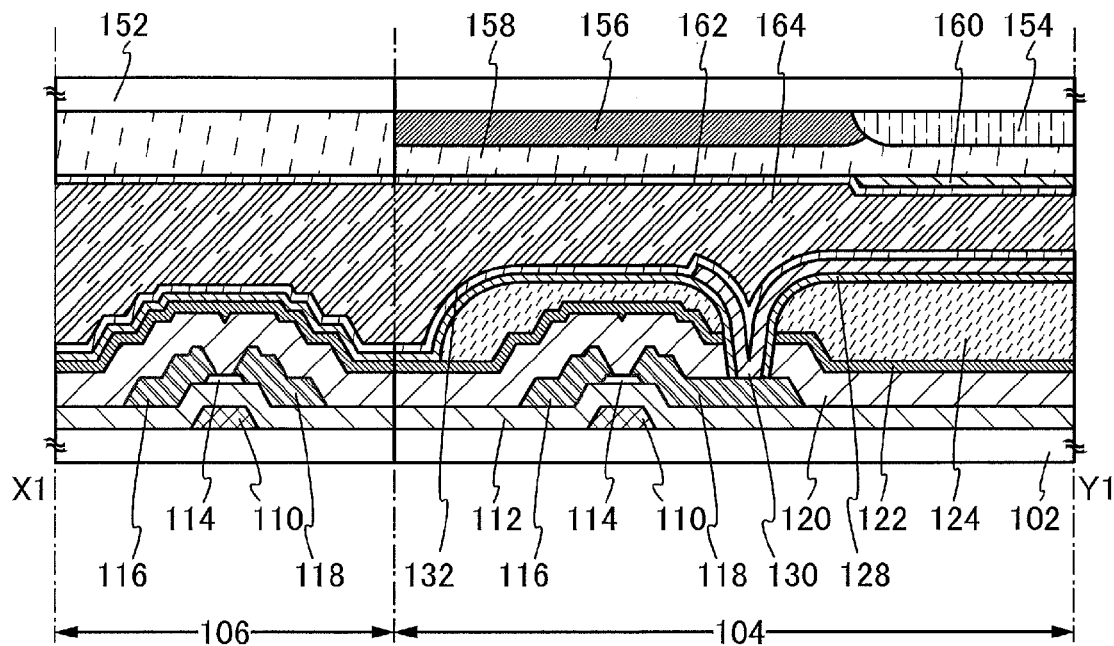
FIGS. 2A and 2B are cross-sectional views along line X1-Y1 in FIG. 1A.

In this embodiment, one mode of a display device will be described with reference to FIG. 2A. FIG. 2A is a cross-sectional view along line X1-Y1 in FIG. 1A. Reference numerals used in common in FIG. 1B and FIG. 2A denote the same components, and different components will only be described.

The display device illustrated in FIG. 2A does not include the common electrode layer 126, which is formed over the second insulating layer 124 in the pixel portion 104 in FIG. 1B.

Advantageous effects similar to those obtained in Embodiment 1 can be obtained in this embodiment.

[Embodiment 3]

Figure 2B:
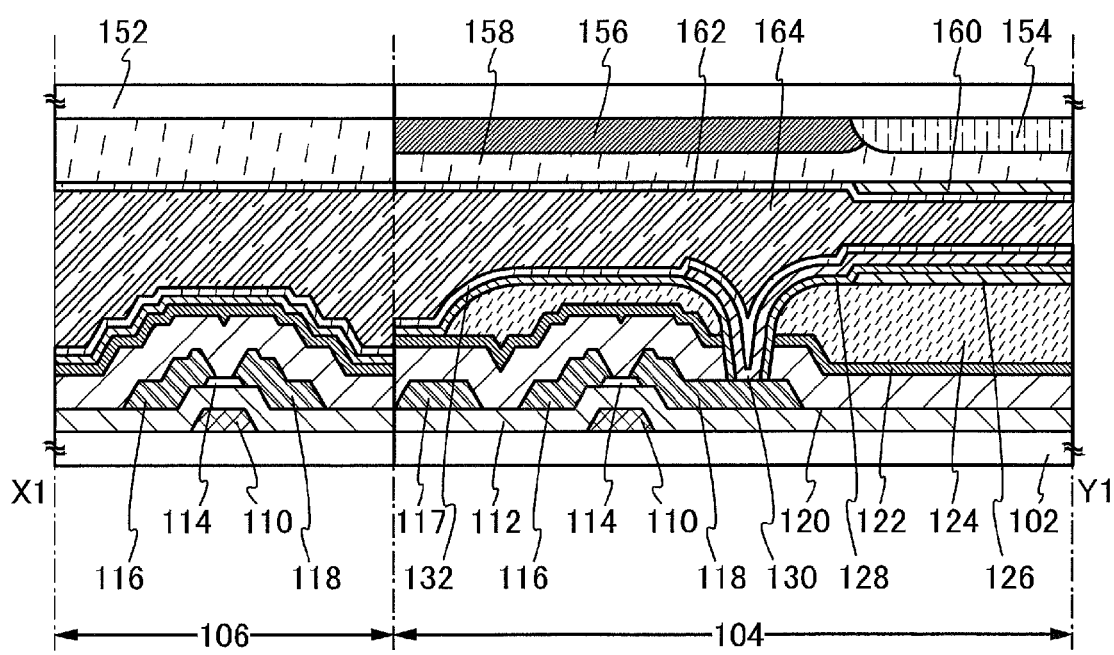

In this embodiment, another mode of the display device will be described with reference to FIG. 2B. FIG. 2B is a cross-sectional view along line X1-Y1 in FIG. 1A. Reference numerals used in common in FIG. 1B and FIG. 2B denote the same components, and different components will only be described.

The display device illustrated in FIG. 2B includes a layer 117 formed over the gate insulating layer 112 in the pixel portion 104. The layer 117 is formed in the vicinity of the boundary between the pixel portion 104 and each of the gate driver circuit portion 106 and the source driver circuit portion 108.

The layer 117 is preferably formed using the same layer as the source electrode layer 116 and the drain electrode layer 118 to be manufactured in the same process. This allows the layer 117 to be formed without increasing the number of masks in a photolithography process.

When the layer 117 is thus formed in the vicinity of the boundary between the pixel portion 104 and each of the gate driver circuit portion 106 and the source driver circuit portion 108, it is possible to moderate the step in the vicinity of that boundary, which is formed because the second insulating layer 124 for reducing the unevenness of the transistor and the like is not formed in the gate driver circuit portion 106 and the source driver circuit portion 108. That is, it is possible to suppress poor flatness on the pixel portion 104 side in the vicinity of that boundary.

In other words, even when the second insulating layer 124 is not formed in the gate driver circuit portion 106 and the source driver circuit portion 108, the flatness in the vicinity of the boundary is less likely to be influenced. This minimizes a decrease in the display quality of the pixel portion 104 in the vicinity of the boundary.

Advantageous effects similar to those obtained in Embodiment 1 can be obtained in this embodiment.

[Modified Examples of Embodiments 1 to 3]

Figure 3A:
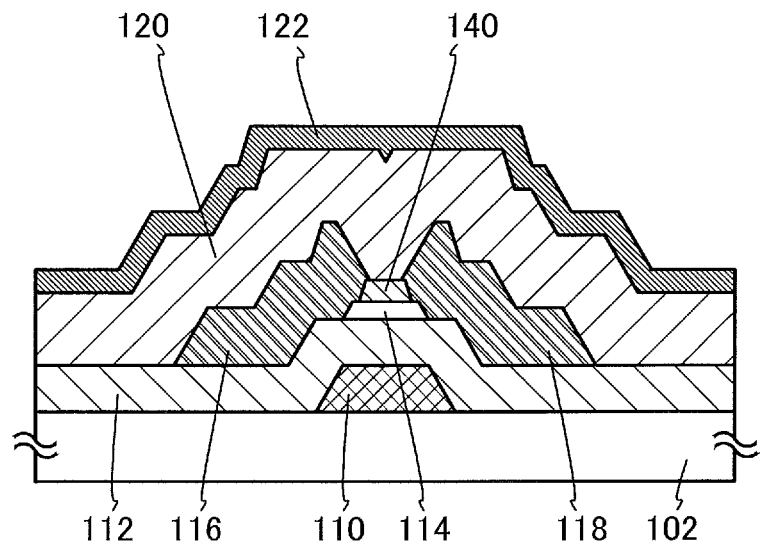
FIGS. 3A and 3B are cross-sectional views of transistors that can be used in pixel portions and driver circuit portions of the display devices illustrated in FIGS. 1A and 1B and FIGS. 2A and 2B.
Figure 3B:
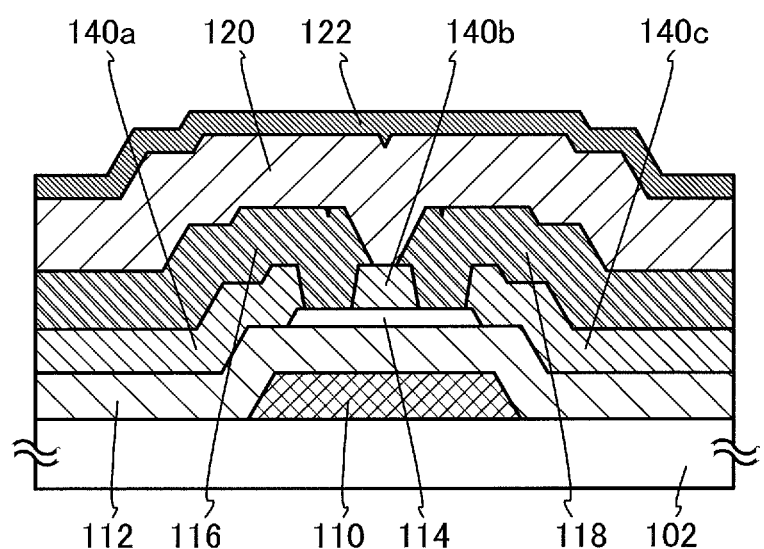

Display devices in these modified examples are obtained by changing the pixel transistor and the driving transistor in Embodiments 1 to 3 into transistors illustrated in FIGS. 3A and 3B.

FIGS. 3A and 3B are cross-sectional views of transistors that can be used in the pixel portions and the driver circuit portions of the display devices illustrated in FIGS. 1A and 1B and FIGS. 2A and 2B.

The transistor illustrated in FIG. 3A includes the first substrate 102; the gate electrode layer 110 formed over the first substrate 102; the gate insulating layer 112 formed over the gate electrode layer 110; the semiconductor layer 114 formed over the gate insulating layer 112 so as to overlap with the gate electrode layer 110; a channel protective layer (e.g., an SiON layer) 140 formed over at least part of the semiconductor layer 114 where a channel is formed; and the source electrode layer 116 and the drain electrode layer 118 formed over the gate insulating layer 112, the semiconductor layer 114, and the channel protective layer 140.

The insulating layer 120 may be provided over the transistor illustrated in FIG. 3A, more specifically, over the gate insulating layer 112, the channel protective layer 140, the source electrode layer 116, and the drain electrode layer 118. Furthermore, the first insulating layer 122 may be provided over the insulating layer 120.

The transistor illustrated in FIG. 3B includes the first substrate 102; the gate electrode layer 110 formed over the first substrate 102; the gate insulating layer 112 formed over the gate electrode layer 110; the semiconductor layer 114 formed over the gate insulating layer 112 so as to overlap with the gate electrode layer 110; channel protective layers (e.g., SiON layers) 140a, 140b, and 140c formed on the periphery of the semiconductor layer 114 or over at least part of the semiconductor layer 114 where the channel is formed; and the source electrode layer 116 and the drain electrode layer 118 formed over the gate insulating layer 112, the semiconductor layer 114, and the channel protective layers 140a, 140b, and 140c.

The insulating layer 120 may be provided over the transistor illustrated in FIG. 3B, more specifically, over the channel protective layers 140a, 140b, and 140c, the source electrode layer 116, and the drain electrode layer 118. Furthermore, the first insulating layer 122 may be provided over the insulating layer 120.

The structures illustrated in FIGS. 3A and 3B, each of which includes the channel protective layer over the semiconductor layer, result in less damage to the semiconductor layer in processing the source electrode layer and the drain electrode layer. In addition, the structure illustrated in FIG. 3B is preferable because the periphery of the semiconductor layer 114 is covered with the channel protective layers and thus the semiconductor layer can be protected from impurities which can enter from the outside.

Such a transistor including the channel protective layer may be used in the pixel portions and the driver circuit portions of the display devices illustrated in FIGS. 1A and 1B and FIGS. 2A and 2B.

This application is based on Japanese Patent Application serial No. 2013-083131 filed with Japan Patent Office on Apr. 11, 2013, the entire contents of which are hereby incorporated by reference.

What is claimed is:

1. A display device comprising a pixel portion and a driver circuit portion outside the pixel portion,
   the pixel portion comprising:
      a pixel transistor;
      a first insulating layer which covers the pixel transistor and includes an inorganic material;
      a second insulating layer which is over the first insulating layer and includes an organic material; and
      a third insulating layer which is over and in direct contact with the second insulating layer and includes an inorganic material,
   the driver circuit portion comprising:
      a driving transistor for supplying a signal to the pixel transistor; and
      the first insulating layer covering the driving transistor,
   wherein the second insulating layer is not formed in the driver circuit portion, and
   wherein the third insulating layer is in direct contact with a top surface and a side surface of the first insulating layer in the pixel portion.

2. The display device according to claim 1, wherein the driver circuit portion comprises the third insulating layer over the first insulating layer.

3. The display device according to claim 2, wherein the first insulating layer is in contact with the third insulating layer in the driver circuit portion.

4. The display device according to claim 1, further comprising a non-display region outside the driver circuit portion,
   wherein the non-display region comprises the first insulating layer and does not comprise the second insulating layer.

5. The display device according to claim 1, wherein a channel of each of the pixel transistor and the driving transistor is formed in an oxide semiconductor layer.

6. The display device according to claim 5, wherein the oxide semiconductor layer comprises at least one oxide selected from the group consisting of indium oxide, tin oxide, and zinc oxide.

7. The display device according to claim 5, wherein the oxide semiconductor layer is an In-Ga-Zn-based oxide semiconductor layer.

8. The display device according to claim 5, wherein the oxide semiconductor layer comprises a crystal part, and
   wherein a c-axis of the crystal part is parallel to a normal vector of a surface where the oxide semiconductor layer is formed.

9. The display device according to claim 1, wherein each of the pixel transistor and the driving transistor comprises a gate electrode, a gate insulating layer over the gate electrode, an oxide semiconductor layer over the gate electrode with the gate insulating layer therebetween, and a source electrode and a drain electrode over the oxide semiconductor layer.

10. The display device according to claim 9, wherein the pixel portion further comprises a layer under the first insulating layer and over the gate insulating layer, and
    wherein the layer is formed in a vicinity of a boundary between the driver circuit portion and the pixel portion.

11. The display device according to claim 10, wherein the layer is formed in the same layer as the source electrode.

12. The display device according to claim 1, wherein the first insulating layer is a silicon film including at least one of oxygen and nitrogen.

13. The display device according to claim 1, wherein the first insulating layer comprises a layered structure of a silicon oxide film and a silicon nitride film.

14. The display device according to claim 1, wherein the first insulating layer comprises a layered structure of a silicon oxynitride film and a silicon nitride film.

15. The display device according to claim 1, wherein the second insulating layer includes an acrylic-based resin material.

16. The display device according to claim 1, wherein the third insulating layer is a silicon film including nitrogen.

17. The display device according to claim 1, wherein the pixel portion further comprises a first electrode and a second electrode,
    wherein the first electrode is over the second insulating layer,
    wherein the third insulating layer is over the first electrode, and
    wherein the second electrode is over the third insulating layer.

18. Electronic device comprising the display device according to claim 1.

19. A display device comprising a pixel portion and a driver circuit portion outside the pixel portion, the pixel portion comprising:
   a pixel transistor;
   a first insulating layer which covers the pixel transistor and includes a silicon film containing oxygen;
   a second insulating layer which is over the first insulating layer and includes an acrylic-based resin material; and
   a third insulating layer which is over and in direct contact with the second insulating layer and includes a silicon film containing nitrogen, the driver circuit portion comprising:
   a driving transistor for supplying a signal to the pixel transistor; and
   the first insulating layer covering the driving transistor, wherein the second insulating layer is not formed in the driver circuit portion, and wherein the third insulating layer is in direct contact with a top surface and a side surface of the first insulating layer in the pixel portion.

20. The display device according to claim 19,
wherein the pixel portion further comprises a first electrode and a second electrode,
wherein the first electrode is over the second insulating layer,
wherein the third insulating layer is over the first electrode, and
wherein the second electrode is over the third insulating layer.

21. Electronic device comprising the display device according to claim 19.

* * * * *